United States Patent [19]

Ruyak

[11] 4,106,825
[45] Aug. 15, 1978

[54] HIGH PRESSURE MAGNETIC DRIVE INCLUDING MAGNETIC THRUST BEARINGS

[75] Inventor: Robert F. Ruyak, Erie, Pa.

[73] Assignee: Autoclave Engineers, Inc., Erie, Pa.

[21] Appl. No.: 749,789

[22] Filed: Dec. 13, 1976

[51] Int. Cl.² ............................................. F16C 17/10
[52] U.S. Cl. ................................... 308/139; 23/290; 308/237 R; 308/DIG. 8
[58] Field of Search .................. 308/10, 35, 3 R, 139, 308/6 R, 158–159, 163, 134.1, 174, 121, 189 R, DIG. 8, 230, 227, 237 R, 238, DIG. 15, DIG. 1, 9, 15; 310/154, 156, 44; 23/290

[56] References Cited

U.S. PATENT DOCUMENTS

| 2,991,161 | 7/1961 | Gasche | 23/290 |
|---|---|---|---|
| 2,996,363 | 8/1961 | Ruyak | 23/290 |
| 3,326,610 | 6/1967 | Baermann | 308/10 |
| 3,909,647 | 9/1975 | Peterson | 310/44 X |

*Primary Examiner*—Trygve M. Blix
*Assistant Examiner*—Douglas C. Butler

*Attorney, Agent, or Firm*—Webb, Burden, Robinson & Webb

[57] ABSTRACT

A high pressure magnetic drive for autoclaves and the like having a novel structure including magnetic thrust bearings. The magnetic drive comprises a tubular nonmagnetic housing securable at an open end to an opening in a pressurizable vessel. A sheave or sleeve coaxial with the housing is mounted rotatably thereto. A driven shaft is journaled in the housing. Circumferentially magnetized rare earth cobalt magnets are mounted in the sheave. The driven shaft has circumferentially magnetized rare earth cobalt magnets secured thereto. The magnets on the sheave and circumferentially magnetized magnets on the driven shaft enable the magnetic transfer of torque. At least one annular rare earth cobalt magnet being axially polarized is secured to the driven shaft. The nonmagnetic tubular housing has at least one annular rare earth cobalt magnet being axially polarized associated therewith to cooperate with the axially polarized magnet on the driven shaft to maintain the axial position of the shaft.

9 Claims, 2 Drawing Figures

HIGH PRESSURE MAGNETIC DRIVE INCLUDING MAGNETIC THRUST BEARINGS

This specification is directed to an improvement in high pressure magnetic drives of the type disclosed in U.S. Pat. No. 2,996,363. The improvement relates, among other things, to magnetic thrust balancing which has been used only where very small axial loads are encountered as shown in U.S. Pat. Nos. 3,233,950 and 3,326,610.

It is an advantage of this invention to provide a rugged, durable, high speed packless magnetic drive having magnetic thrust balancing.

SUMMARY OF THE INVENTION

Briefly, according to this invention, there is provided a magnetic drive for transmitting torques to the interior of a pressurized vessel. The magnetic drive comprises a tubular housing securable at one end to an opening in the pressurizable vessel and sealed at the opposite end. In this way, the housing is subject to the vessel pressure.

A drive sleeve or sheave is mounted coaxial with the housing and is rotatably mounted thereto. The drive sleeve supports circumferentially polarized cylindrical rare earth cobalt magnets or the like. A driven shaft is journaled in said housing by bushings that impose no axial restraint on the shaft when it is in the axial position desired. The shaft is long enough to extend through the opening in the housing. Therefore, the shaft may extend into the pressure vessel where it may have an attached propeller or the like. The shaft has mounted thereto annular magnets being rare earth cobalt magnets circumferentially magnetized. When the drive sleeve or sheave is turned, the driven shaft follows. This drive is of the synchronous magnetic type in which the driving magnets and the driven magnets move at the same angular speed.

The driven shaft has attached thereto at least one other cylindrical rare earth cobalt magnet axially polarized. The nonmagnetic tubular housing has associated therewith at least one cylindrical rare earth cobalt magnet axially polarized. The cylindrical magnet associated with the housing is arranged to cooperate with the axially polarized cylindrical magnet attached to the drive shaft to exert a force which maintains the axial position of the drive shaft.

According to a preferred embodiment of this invention, two axially polarized cylindrical magnets are mounted to the driven shaft and two axially polarized cylindrical magnets are fixed to the housing such that two pairs of opposing magnets are formed, each pair of magnets urging the shaft towards a central position.

DESCRIPTION OF PREFERRED EMBODIMENTS

Figure 1:
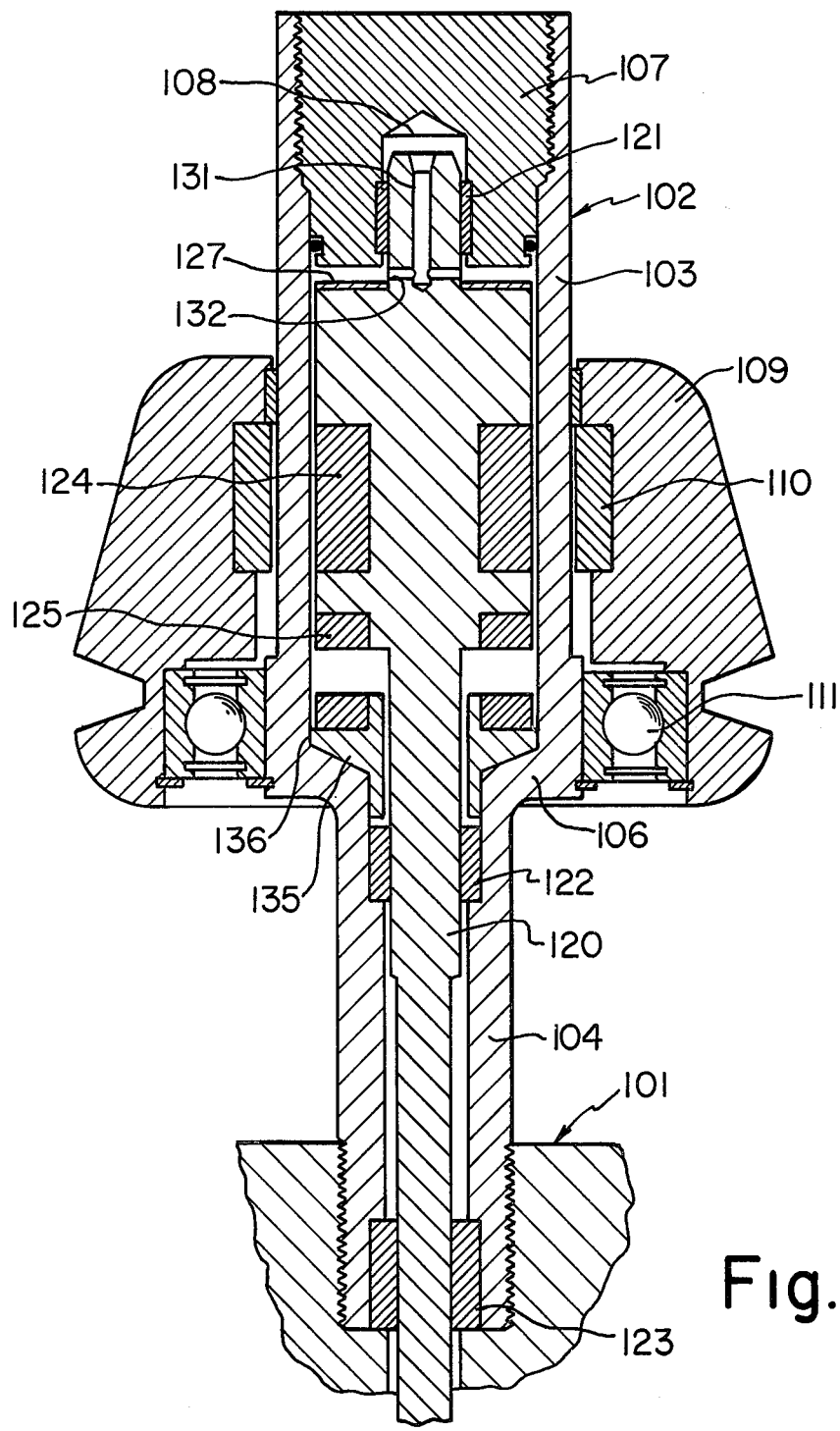

Further features and other objects and advantages of this invention will become clear from the following detailed description made with reference to the drawings in which FIG. 1 is a magnetic drive wherein the driven shaft is only exposed to a downward axial thrust.

Figure 2:
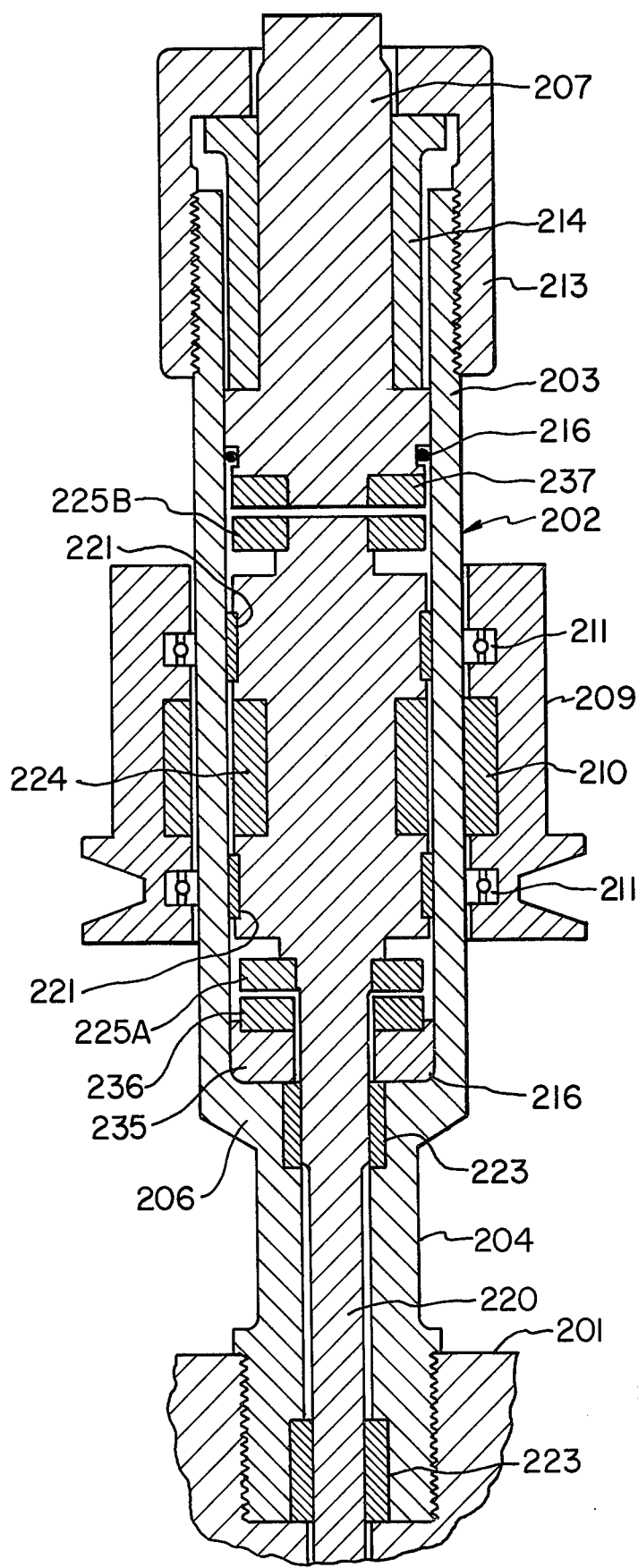

FIG. 2 is a magnetic drive wherein the driven shaft is exposed to both downward and upward axial thrust.

Referring now to FIG. 1 there is shown, in section, the top or cover of a pressure vessel 101. Secured to the pressure vessel is a cylindrical drive housing 102. The drive housing is comprised of two portions, a portion of larger diameter 103 and a portion of smaller diameter 104. Joining the portion of larger and smaller diameter is an annular seat 106. The end of the cylindrical housing of larger diameter has threadably fixed thereto a plug 107. The plug is arranged with a recess 108, the purpose of which will be explained hereafter.

Surrounding the larger portion of the cylindrical housing 102 is a drive sheave 109 journaled to the housing by bearings 111. The purpose of the drive sleeve is to carry drive magnets 110 which are cylindrical magnets of the rare earth cobalt type being circumferentially magnetized. That is, the magnets have a plurality of alternating north and south poles around the inner periphery thereof. Positioned within the housing, is a driven shaft assembly 120. The driven shaft assembly is journaled by bushing 121 in the recess 108 of the plug 107, by bushings 122 and 123 in the portion of the housing having the smaller diameter 104. These bushings provide no axial restraint on the driven shaft assembly 120. Preferably the bushings are of the synthetic polymer type such as those sold under the trade name RULON or carbon graphite type sold under the trade name PUREBON. Secured to the driven shaft assembly are driven magnet or magnets 124 which are cylindrical magnets of the rare earth cobalt type, preferably samarium cobalt which magnets are circumferentially magnetized. In other words, the driven magnets have a plurality of alternating poles surrounding the outer cylindrical surface thereof. The number of poles is equal to the number of poles in the inner cylindrical surface of the driving magnets having the same uniform angular spacing. Also secured to the driven shaft assembly is an axially magnetized cylindrical magnet of the rare earth cobalt type 125. The magnet is arranged facing the annular seat 106 between the larger and smaller diameter portions of the cylindrical housing.

According to the preferred embodiment of this invention, the rare earth magnets secured to the driven shaft assembly are, with those portions of the driven shaft assembly supporting them, encapsulated in a thin nonmagnetic can (not shown). Upon the upper axial surface of driven shaft assembly 120 is a auxiliary thrust surface 127, for example, an annular covering of a synthetic material such as those sold under the trade name RULON. The surface enables the driven magnet assembly to move relative to the plug, when under abnormal circumstances the surface contacts the plug. The driven shaft assembly has a horizontal bore 132 and a vertical bore 131 at the upper end thereof for enabling pressure to bypass the bearing 121 in the plug thereby equalizing the pressure applied on both ends of the driven shaft. This is a preferred feature. It should be understood that the bushings 122 and 123 are grooved and allow gases to pass thereby into the cylindrical housing thus equalizing the pressure between the pressure vessel and the housing.

Adjacent the cylindrical seat 106 is a magnet holder 135 held fixed relative to the housing 102. Secured in the magnet holder is a cylindrical magnet 136 being a cylindrical magnet of the rare earth cobalt type being axially magnetized and arranged such that it opposes the cylindrical magnet 125 fixed to the shaft assembly 120. The strength of the magnets 125 and 136 and the space therebetween is predetermined such that the driven shaft assembly 120 is positioned under operating conditions with circumferential driving and driven magnets aligned. As explained in the summary above, when the drive sleeve or sheave is turned, the driven shaft follows. Hence, with reference to the embodiment of FIG. 1, when sheave 109 is turned it carries the circumferentially magnetized cylindrical or annular magnets 110 fixed thereto. The magnets 124 on the driven shaft assembly 120 are also cylindrically magnetized. Opposed magnetic poles on magnets 110 and 124 tend to align and remain aligned. Thus, as explained above, the driving and driven magnets move at the same angular speed, that is, the drive is of the synchronous magnetic type.

As explained in the summary, the driven shaft has at least one axially polarized magnet which cooperates with an axially polarized magnet associated with the housing to exert a force to maintain the axial position of the driven shaft. With reference to the embodiment of FIG. 1, axially polarized magnets 125 and 136 have opposed pole faces which repulse each other. In this way, the downward movement resulting from gravity and the axial thrust forces of the driven shaft assembly are restricted.

Referring now to FIG. 2, there is shown another embodiment of this invention in which the driven shaft is subject to both upward and downward axial thrust. Generally speaking the parts of the magnet drive shown in FIG. 2 correspond to the parts described with reference to FIG. 1 with 100 added to the identifying numeral. As explained in the summary and with reference to FIG. 1, a synchronous drive is provided. Hence, with reference to FIG. 2, sleeve 209 is turned carrying driving magnets 210. The poles on the driven magnet 224 tend to align with opposite poles on the driving magnet 210. Hence, when sleeve 209 is turned, driven shaft assembly 220 is carried therewith at the same angular speed.

The most significant difference between the embodiments shown in FIGS. 1 and 2 is that in the embodiment shown in FIG. 2 there are two axially magnetized cylindrical magnets located at space locations along the driven shaft assembly. These magnets are labeled 225A and 225B. Magnet 225A is arranged to oppose fixed magnet 236. Secured to the end of the plug 207 is a second fixed axially magnetized cylindrical rare earth cobalt magnet 237 arranged to oppose magnet 225B.

According to a preferred embodiment of this invention, the plug 207 is arranged to be axially adjustable. Gland 213 is threadably secured to the cylindrical housing. A sleeve 214 is arranged between the plug 207 and the housing 203. At one end the sleeve bears upon the gland and at the other end, the sleeve bears upon the plug. As the gland is turned to move axially away from the pressure vessel, the pressure in the vessel moves the plug and sleeve upwardly. The plug assembly is sealed to the housing by O-ring 216 which may, for example, be of the Teflon type.

The opposing forces of the lower magnetic pair (225A and 236) and upper magnetic pair (225B and 237) position the driven shaft assembly under working conditions such that the driven and driving cylindrical magnets are aligned. The adjustability of the plug 207 enables the equilibrium position to be adjusted somewhat when varying upward axial thrusts are encountered during the operation of the drive. However it should be noted that because the repulsive force between two opposing magnets increases the closer the magnets become there is a self-balancing feature inherent in the above described embodiment.

Having thus described by invention in the detail and with the particularity required by the Patent Laws, what is desired and claimed by Letters Patent is set forth in the following claims.

1. A magnetic drive assembly for transmitting torques to the interior of a pressurizable vessel or the like comprising:

a nonmagnetic tubular housing having two portions, one of larger diameter than the other, there being an annular step between the portions of the housing having different diameters, said housing having at the end of the portion of smaller diameter an opening securable to an opening in a pressurizable vessel whereby the housing may be subjected to the vessel pressure, said housing having an opening in the end of the portion of larger diameter and a plug for sealing said last mentioned end;

a sheave coaxial with and surrounding said larger diameter portion of the tubular housing, said sheave mounted rotatably thereto, said sheave carrying circumferentially magnetized rare earth cobalt magnets defining an even number of north and south magnetic poles having substantially equal angular spacing;

a driven shaft journaled in said housing by bushings that impose no axial restraint on said shaft and permit axial passage of the pressurized atmosphere to equalize pressure within said housing, said shaft being long enough to extend through an opening of said housing, said shaft having mounted thereto circumferentially magnetized cylindrical rare earth cobalt magnets defining an equal number of north and south magnetic poles having the same substantially equal angular spacing as the magnets mounted in said sheave, such that when the sheave is turned the driven shaft will follow, said shaft having at least one annular rare earth cobalt magnet being coaxial with and attached to said driven shaft, in the vicinity of the annular step, said annular magnet being axially polarized;

said nonmagnetic tubular housing having associated therewith at least one annular rare earth cobalt magnet coaxial with the driven shaft secured to the tubular housing near the annular step and said annular magnet being axially polarized and arranged to cooperate with the axially polarized annular magnet attached to said driven shaft so that magnetically opposite poles face to thus repulse the axial movement of the driven shaft toward the pressure vessel maintaining the axial position of said shaft.

2. A magnetic drive according to claim 1 wherein the magnets are samarium cobalt magnets.

3. A magnetic drive according to claim 1 wherein the bushings are of a synthetic polymer.

4. A magnetic drive assembly for transmitting torques to the interior of a pressurizable vessel or the like comprising;

a nonmagnetic tubular housing having two portions, one of larger diameter than the other, there being an annular step between the portions of the housing having different diameters, said housing having at the end of the portion of smaller diameter an opening securable to an opening in a pressurizable vessel whereby the housing may be subjected to the vessel pressure, said housing having an opening in the end of the portion of larger diameter and a plug for sealing said last mentioned end, said plug having an axial recess facing the interior of the housing;

a sheave coaxial with and surrounding said larger diameter portion of the tubular housing, said sheave mounted rotatably thereto, said sheave carrying circumferentially magnetized rare earth cobalt magnets defining an even number of north and south magnetic poles having substantially equal angular spacing;

a driven shaft journaled in said housing by bushings that impose no axial restraint on said shaft, there being one bushing located in the axial recess of said plug and another bushing located in the portion of the housing having the smaller diameter, said bushings permitting axial passage of the pressurized atmosphere to equalize pressure within the housing, said shaft being long enough to extend through an opening of said housing, said shaft having mounted thereto circumferentially magnetized cylindrical rare earth cobalt magnets defining an equal number of north and south magnetic poles having the same substantially equal annular spacing as the magnets mounted in said sheave, such that when the sheave is turned the driven shaft will follow, said driven shaft having an annular rare earth cobalt magnet being coaxial with and attached to said shaft in the vicinity of said annular step, said annular magnet being axially polarized;

said nonmagnetic tubular housing having associated therewith an annular rare earth cobalt magnet coaxial with the driven shaft secured near the annular step in the tubular housing and said annular magnet being axially polarized and arranged to cooperate with the axially polarized annular magnet attached to said driven shaft so that magnetically opposite poles face to thus repulse the axial movement of the driven shaft toward the pressure vessel maintaining the axial position of the shaft.

5. A magnetic drive according to claim 4 wherein the magnets are samarium cobalt magnets.

6. A magnetic drive according to claim 4 wherein the bushings are of a synthetic polymer.

7. A magnetic drive assembly for transmitting torques to the interior of a pressurizable vessel or the like comprising:

a nonmagnetic tubular housing having two portions, one of larger diameter than the other, there being an annular step between the portions of the housing having different diameters, said housing having at the the end of the portion of smaller diameter an opening securable to an opening in a pressurizable vessel whereby the housing may be subjected to the vessel pressure, said housing having an opening in the end of the portion of larger diameter and a plug for sealing said last mentioned end;

a sheave coaxial with and surrounding said larger diameter portion of the tubular housing, said sheave mounted rotatably thereto, said sheave carrying circumferentially magnetized rare earth cobalt magnets, defining an even number of north and south magnetic poles having substantially equal angular spacing;

a driven shaft journaled in said housing by bushings that impose no axial restraint on said shaft and permit axial passage of the pressurized atmosphere to equalize pressure within said housing, said shaft being long enough to extend through an opening of said housing, said shaft having mounted thereto circumferentially magnetized cylindrical rare earth cobalt magnets defining an equal number of north and south magnetic poles such that when the sleeve is turned the driven shaft will follow, said driven shaft having two spaced annular axially polarized rare earth cobalt magnets coaxial with and attached to said shaft, one in the vicinity of the plug sealing said large diameter end and the other in the vicinity of the annular step in the housing, said housing having secured thereto two annular axially polarized magnets being coaxial with said housing, one attached to said plug and the other secured near the annular step, the polarity of all four annular magnets being such that two pairs of repulsing magnets urge the driven shaft to a desired axial position.

8. A magnetic drive according to claim 7 wherein the magnets are samarium cobalt magnets.

9. A magnetic drive according to claim 7 wherein the bushings are of a synthetic polymer.

* * * * *